(12) United States Patent
Clevenger et al.

(10) Patent No.: US 7,112,502 B2
(45) Date of Patent: Sep. 26, 2006

(54) METHOD TO FABRICATE PASSIVE COMPONENTS USING CONDUCTIVE POLYMER

(75) Inventors: Lawrence A. Clevenger, LaGrangeville, NY (US); Louis L. Hsu, Fishkill, NY (US); Carl J. Radens, LaGrangeville, NY (US); Li-Kong Wang, Montvale, NJ (US); Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 186 days.

(21) Appl. No.: 10/828,374

(22) Filed: Apr. 20, 2004

(65) Prior Publication Data

US 2004/0195654 A1    Oct. 7, 2004

Related U.S. Application Data

(62) Division of application No. 09/897,891, filed on Jul. 5, 2001, now Pat. No. 6,958,522.

(51) Int. Cl.
*H01L 21/20* (2006.01)

(52) U.S. Cl. .................. 438/381; 438/82; 438/382; 438/393; 438/455

(58) Field of Classification Search ............... 438/381, 438/82, 171, 190, 210, 238, 329, 382, 393, 438/455, 780

See application file for complete search history.

(56) References Cited

U.S. PATENT DOCUMENTS 4,115,750 A  *  9/1978  Hansen et al. ............. 337/107

| | | | |
|---|---|---|---|
| 4,409,608 A | * | 10/1983 | Yoder ..................... 257/534 |
| 5,492,863 A | * | 2/1996 | Higgins, III ............. 438/610 |
| 5,855,755 A | * | 1/1999 | Murphy et al. ........... 205/122 |
| 5,912,507 A | | 6/1999 | Dunn et al. |
| 6,021,050 A | | 2/2000 | Ehman et al. |
| 6,108,212 A | | 8/2000 | Lach et al. |
| 6,210,537 B1 | | 4/2001 | Murphy et al. |
| 6,291,305 B1 | | 9/2001 | Huang et al. |

FOREIGN PATENT DOCUMENTS

JP    402273926 A    11/1990
JP    407058439 A    3/1995

OTHER PUBLICATIONS

PCT International Search Report, PCT/US02/16290, May 23, 2002, 5 pages.

* cited by examiner

*Primary Examiner*—Matthew Smith
*Assistant Examiner*—Jarrett J. Stark
(74) *Attorney, Agent, or Firm*—Gibb I.P. Law Firm, LLC; Robert M. Trepp, Esq.

(57) ABSTRACT

A method and structure for an integrated circuit chip has a logic core which includes a plurality of insulating and conducting levels, an exterior conductor level and passive devices having a conductive polymer directly connected to the exterior conductor level. The passive devices contain RF devices which also includes resistor, capacitor, and/or inductor. The resistors can be serpentine resistors and the capacitors can be interdigitated capacitors.

5 Claims, 6 Drawing Sheets

METHOD TO FABRICATE PASSIVE COMPONENTS USING CONDUCTIVE POLYMER

CROSS-REFERENCE TO RELATED APPLICATIONS

This application is a division of U.S. application Ser. No. 09/897,891 filed Jul. 5, 2001 now U.S. Pat. No. 6,958,522.

BACKGROUND OF THE INVENTION

1. Field of the Invention

The present invention generally relates to integrated circuits and more particularly to an improved integrated circuit that includes passive devices formed over active devices using a conductive polymer.

2. Description of the Related Art

Integrated circuits for wireless applications are driven to higher levels of integration to reduce the processing and design costs. To integrate passive components such as RF (radio frequency) circuits with the digital core is highly desirable. Today's mobile cellular phone has hundreds components. Most of them are passive devices. To integrate them into a single chip is not only cost effective, but also can reduce the power consumption in the system. However, the passive components, such as inductors, capacitors and resistors, and those that are used for the RF and analog functions, consume large chip area due to the size of these elements. In addition, these elements tend to interact strongly with the active transistor RF devices from substrate coupling.

Therefore, there is a need to include such passive devices within the digital core without consuming valuable chip area and while avoiding undesirable interaction between RF components and the sensitive components within the digital core. The invention discussed below addresses these issues by presenting a novel structure and method to form the same. The conventional design uses metal conductors to fabricate such passive components. These are limited by thickness of the chip technology and occupy valuable chip area. Then placing passive components on top of the chip save chip area, make them larger in size and places far away from the device components on the chip thereby reducing interference and allowing better isolation.

SUMMARY OF THE INVENTION

In view of the foregoing and other problems, disadvantages, and drawbacks of the conventional integrated circuits the present invention has been devised, and it is an object of the present invention to provide a structure and method for an improved integrated circuit.

In order to attain the object(s) suggested above, there is provided, according to one aspect of the invention an integrated circuit chip having a logic core which includes a plurality of insulating and conducting levels, an exterior conductor level and passive devices having a conductive polymer directly connected to the exterior conductor level. The passive devices contain RF devices which also includes at least one resistor, capacitor, and inductor. The resistors can be serpentine resistors and the capacitors can be interdigitated capacitors.

The invention also has an exterior conductor level above the insulating and conducting levels, a conductive polymer directly connected to the exterior conductor level and a substrate connected on a side of the passive devices opposite from the exterior conductor level.

Another embodiment of the invention includes a method of manufacturing an integrated circuit chip structure. In this method, the device is supplied and patterned with a conductive polymer on the exterior of the integrated circuit chip. The patterning process produces the passive devices.

Finally, the manufacture of the integrated circuit chip structure can also include patterning a conductive polymer on a substrate and bonding the patterned conductive polymer to the integrated circuit chip.

The conducting polymer passive component process is low in cost, provides area saving and is flexible. Since the component is located on the top of the chip, it can be easily trimmed and modified by a simpler process than that of the oxide, copper counterparts. The trimming process is important in certain analog applications such as RF high performance narrow band usages.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

As mentioned above, there is a need to include passive devices within the digital core of integrated circuit chips without consuming valuable chip area and while avoiding undesirable interaction between RF components and the components within the digital core. The invention satisfies this need by making passive components as a separate conductive layer on the top of the processed chip or on a separate substrate. The invention is especially useful with conductive polymers, which can be processed at very low temperatures and to have large thicknesses. Since the polymer process, such as deposition, annealing and patterning are done at very low temperature (100–300° C.), the process will not affect the property of the underneath device chip.

Figure 1:
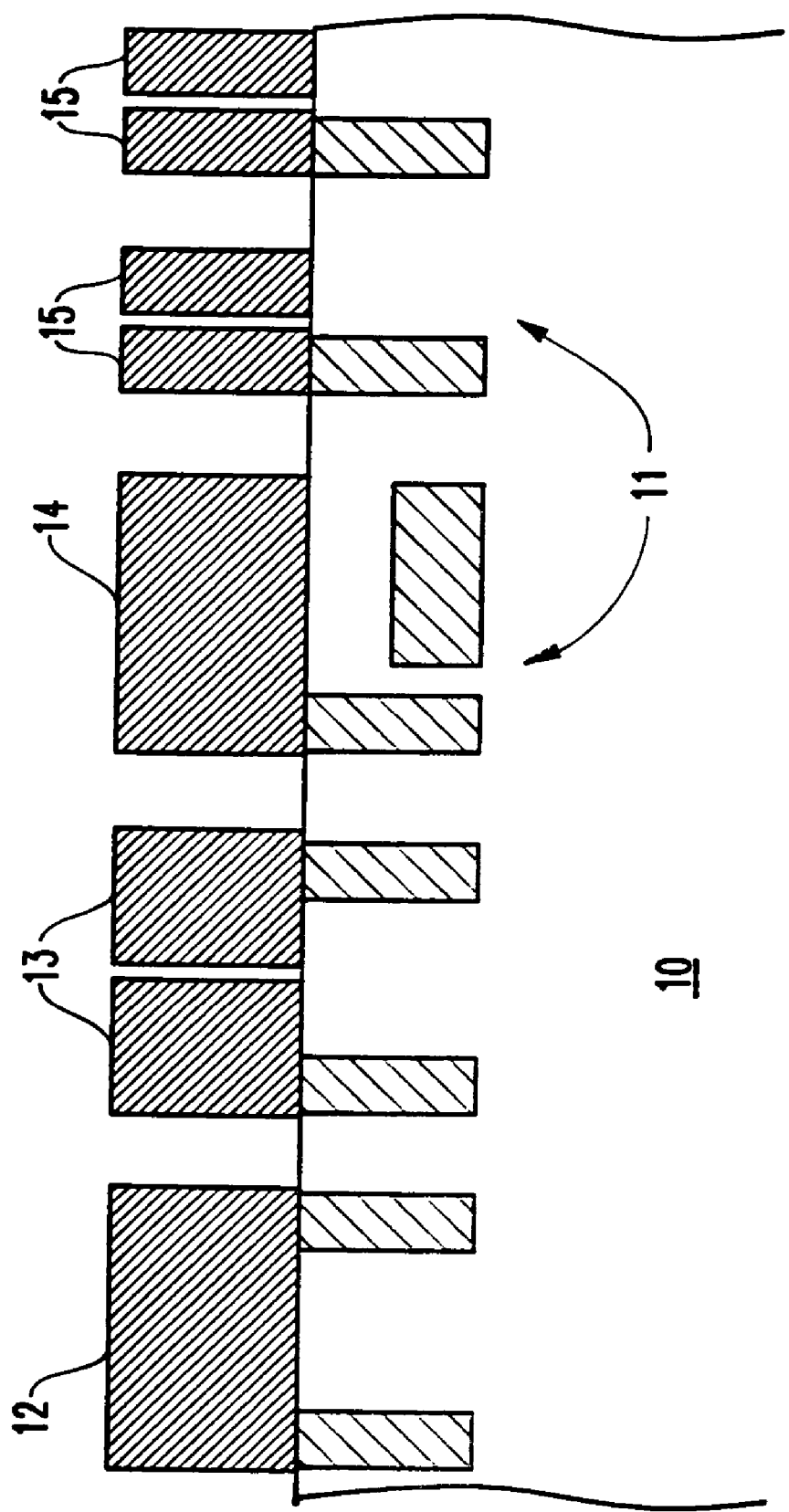
FIG. 1 is a schematic cross-sectional diagram of an integrated circuit chip according to the invention.

One embodiment of the invention is shown in FIG. 1 where passive devices such as capacitors 13, 14, inductors 15 and a resistor 12 are fabricated on top of a completed chip 10. These passive components 12–15 have large relatively dimensions (thickness) when compared to devices within the chip 10 to lower the resistance. The metal interconnections 11 and silicon area of the chip 10 are not affected as a result of placing the passive devices 12–15 on top of the chip.

The passive devices can even be used in the same level with the packaging pads. Since the conductive polymer passive components are fabricated on top of the chip, they are placed at the same level as the packaging pads such as wire bond pads.

In a preferred embodiment, the integrated circuit chip 10 is manufactured as a finished product using conventional techniques well known to those ordinarily skilled in the art. In previous structures, the large and passive devices would be manufactured separately and connected to the chip 10 by wiring the passive devices to the contacts 11 within the integrated circuit chip 10. However, the invention forms the passive devices 12–15 directly on the finished integrated circuit chip 10. This incorporates the passive devices as an integral part of the integrated circuit chip structure 10, yet separates these RF devices from the sensitive digital core within the integrated circuit chip 10.

The invention utilizes well-known conductive polymer deposition and patterning techniques to form the passive devices 12–15. Electronically conducting polymers, particularly derivatives of polypyrrole and polyaniline, in which the conducting form of the polymers is soluble in appropriate organic solvents, have been used in many electronic applications. These polymers can be applied onto silicon wafers by spin-on or silk screening techniques. For example, conducting polypyrrole has been proposed as an ingredient to make passive elements such as resistors, capacitors and inductors in multichip modules or printed wiring boards, as disclosed in U.S. Pat. No. 5,855,755 issued to Murphy et al. (incorporated herein by reference).

Moreover, polypyrrole and polythiophene derivatives have been used in solid state electrochromic devices. The polypyrrole conducting polymer can be made to be photosensitive by adding appropriate silver salts and photoinitator additives, as disclosed in U.S. Pat. No. 5,919,402 issued to Murphy et al. (incorporated herein by reference). It has been discovered that under optimized conditions, the conductivity value for poly(3-methylthiophene) is 5.7 $Omega^{-1}cm^{-1}$. Electrical conductivity can be further increased by incorporating metal particles such as nanoparticles of silver or copper in the polymer formulation.

The passive devices are formed at relatively low temperatures (100–300° C.). Such processing temperatures do not alter the structure of the integrated circuit chip 10. In most of the technology today, integration of passive components into the process requires additional deposition, annealing and patterning processes. Since the kind of components described in the present invention are polymer in nature the processing temperature are low (100–300° C.), which is much lower than the conventional copper oxide processing temperatures of >300° C. Because the temperature to process the components are lower, the thermal process impacts of the device underneath is reduced.

Such inductive polymers have not been known in the art until recently. The use of conductive polymers as passive components for radio frequency devices is a new concept and, present invention, uses a conducting polymer to fabricate passive devices such as inductor, capacitor and resistors by applying the merit of easy processing, high aspect ratio, conformal and low temperature process characteristics.

The use of a separate passive component chip not only provides a high yield, low cost solution to the placement of RF passive components, but also provides extensive flexibility by using a polymer process. For example, as shown in FIGS. 2(a)–5(b) many different shapes can be easily formed using a conductive polymer to create different passive devices over the integrated circuit chip 10. More specifically, the shapes shown in FIGS. 2(a)–5(b) are formed using conventional patterning techniques, such as polymer deposition, photolithography and etching.

Figure 2A:
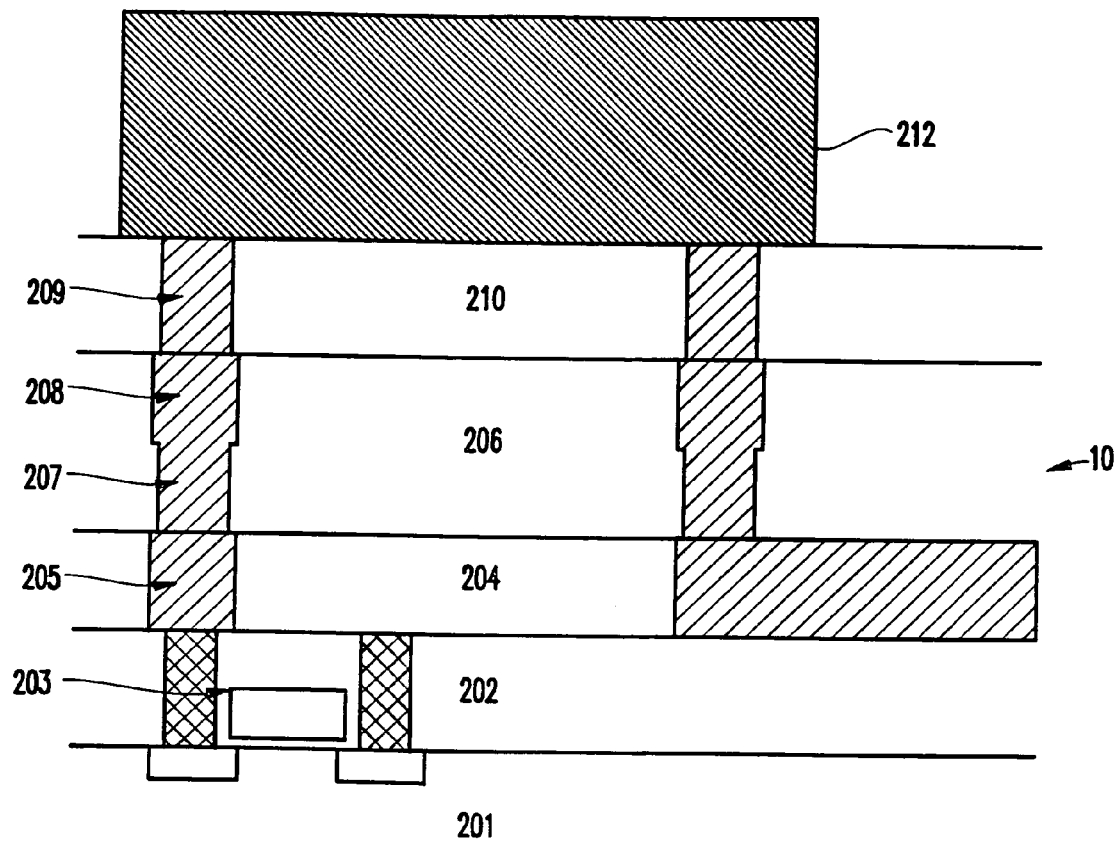
FIG. 2(a) is a schematic cross-sectional diagram of an integrated circuit chip according to the invention.
Figure 2B:
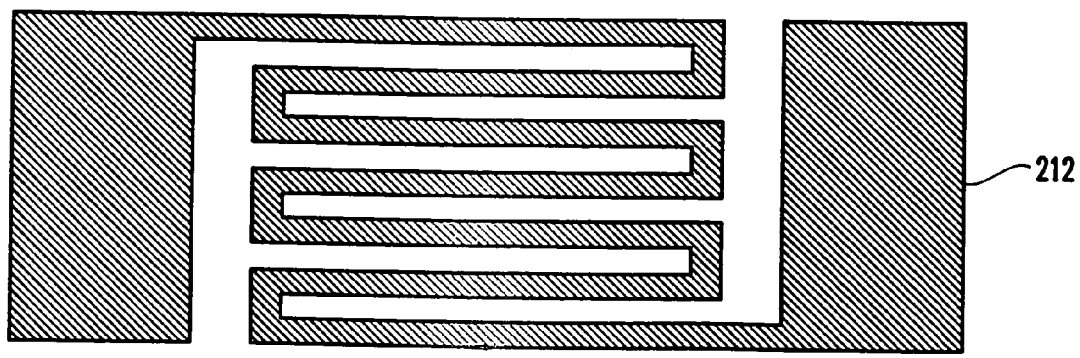
FIG. 2(b) is a schematic top-view diagram of an integrated circuit chip according to the invention.

In one example, the conductive polymer is formed into a narrow serpentine shaped wire to form a resistor 212, as shown in FIGS. 2(a) and 2(b). The bottom portion of FIG. 2(a) shows the structure of a logic core or integrated circuit chip (203) with several levels of interconnects (205, 208) and inter level dielectrics (204, 206, 210). The metal levels as indicated by metal 1 (205), metal 2 (208) and conducting polymer (209) are connected by the via contact levels 207 and 209. The processes used to form the logic chip 203 and the layers of insulator and conductor above the logic chip are well-known to those ordinarily skilled in the art and are not discussed in detail here and so as not to unnecessarily obscure the salient features of the invention.

Figure 3A:
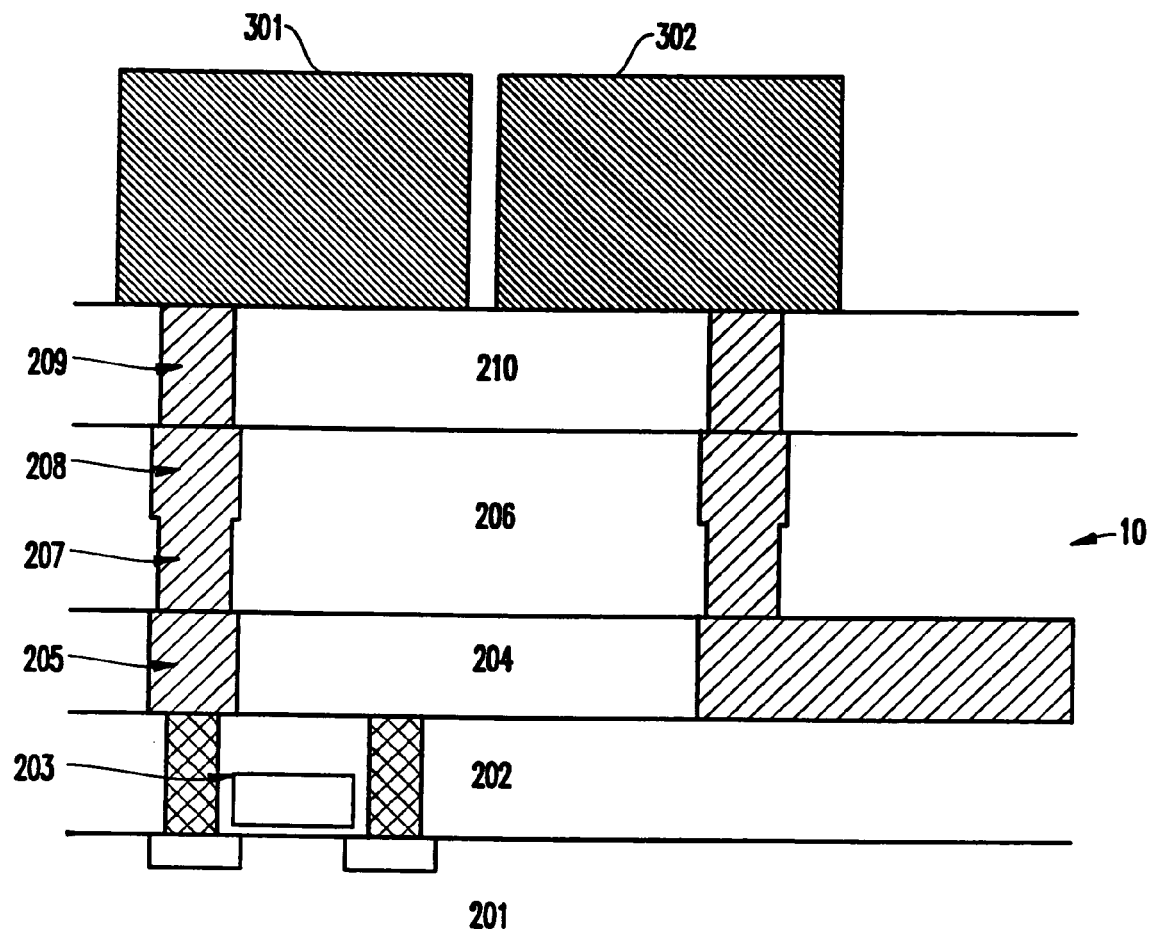
FIG. 3(a) is a schematic cross-sectional diagram of an integrated circuit chip according to the invention.
Figure 3B:
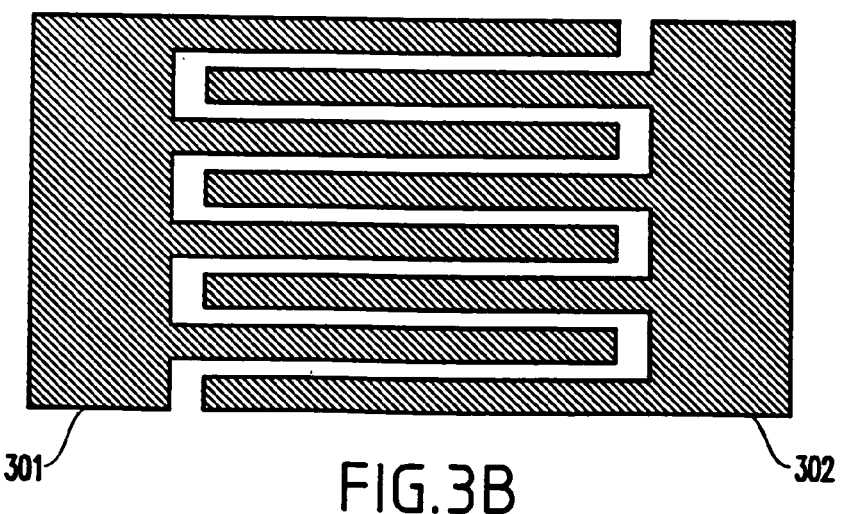
FIG. 3(b) is a schematic top-view diagram of an integrated circuit chip according to the invention.
Figure 4:
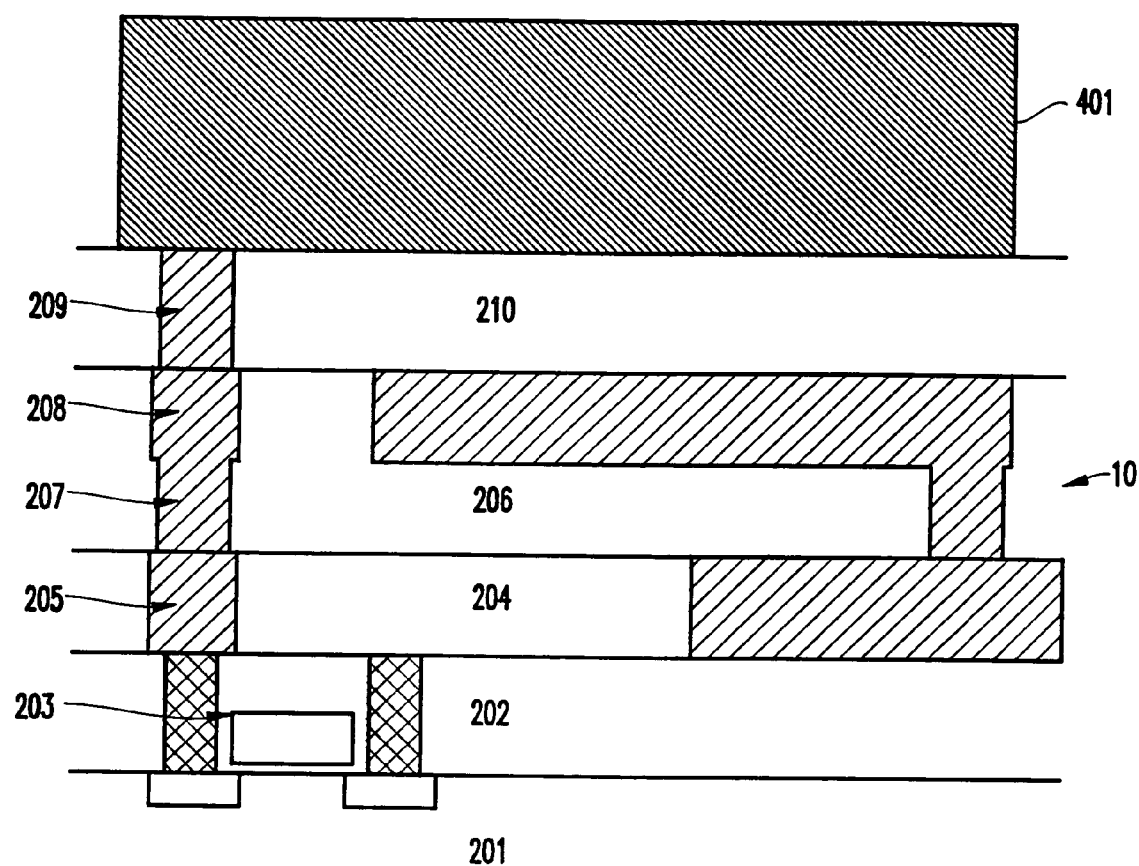
FIG. 4 is a schematic cross-sectional diagram of an integrated circuit chip according to the invention.

There are many types of capacitors that can be fabricated, such as planar or interdigited capacitors. The planar structure capacitor usually provides a large capacitance value but occupies a large area. The interdigited capacitor can have large capacitance from the thick conducting polymer film, but the patterning of the small gap distance between the fingers can be difficult to control. One interdigited type capacitor structure and layout is shown in FIGS. 3(a) and 3(b) where the capacitor electrode (301) and counter electrode (302) are separated by a narrow gap. A planar capacitor is shown in FIG. 4. This planar type capacitor is formed between the rectangular shaped conducting polymer (401) and the metal layer (208) which are separated by the dielectric layer (210), as shown in FIG. 4.

Figure 5A:
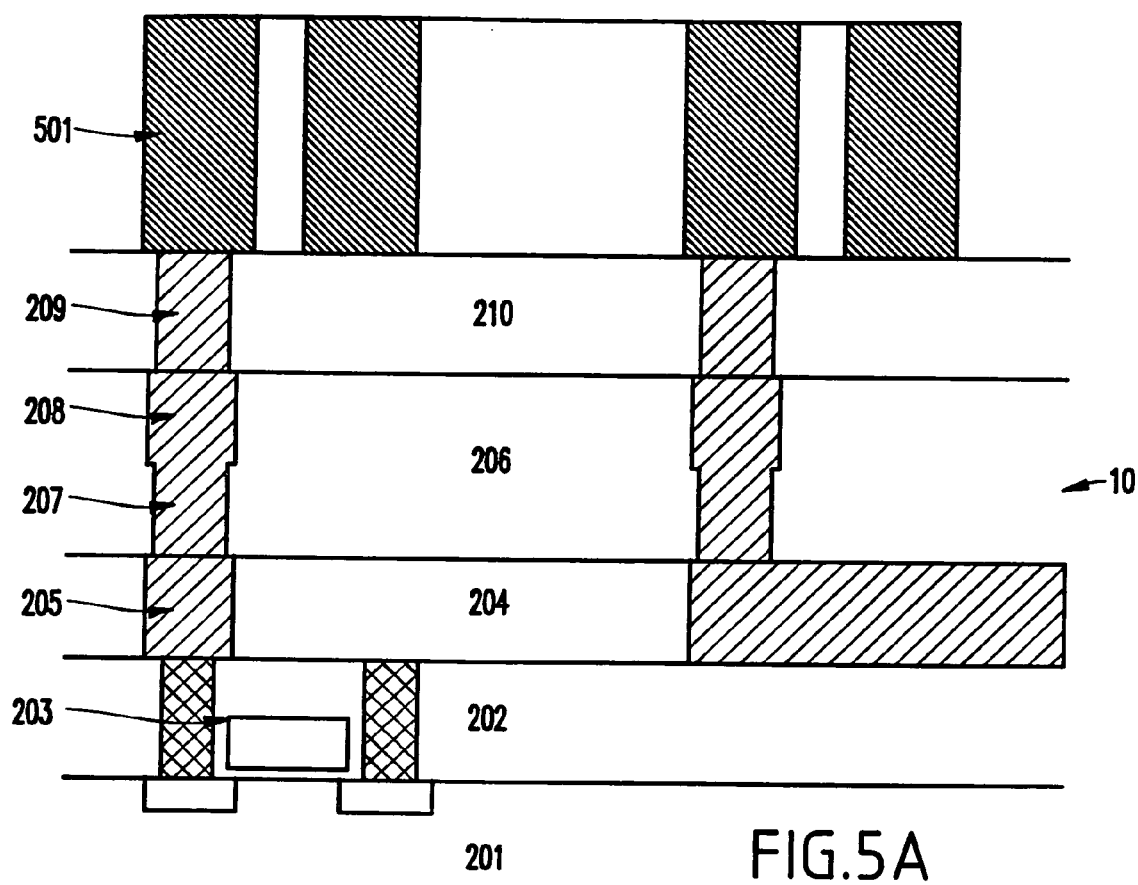
FIG. 5(a) is a schematic cross-sectional diagram of an integrated circuit chip according to the invention.
Figure 5B:
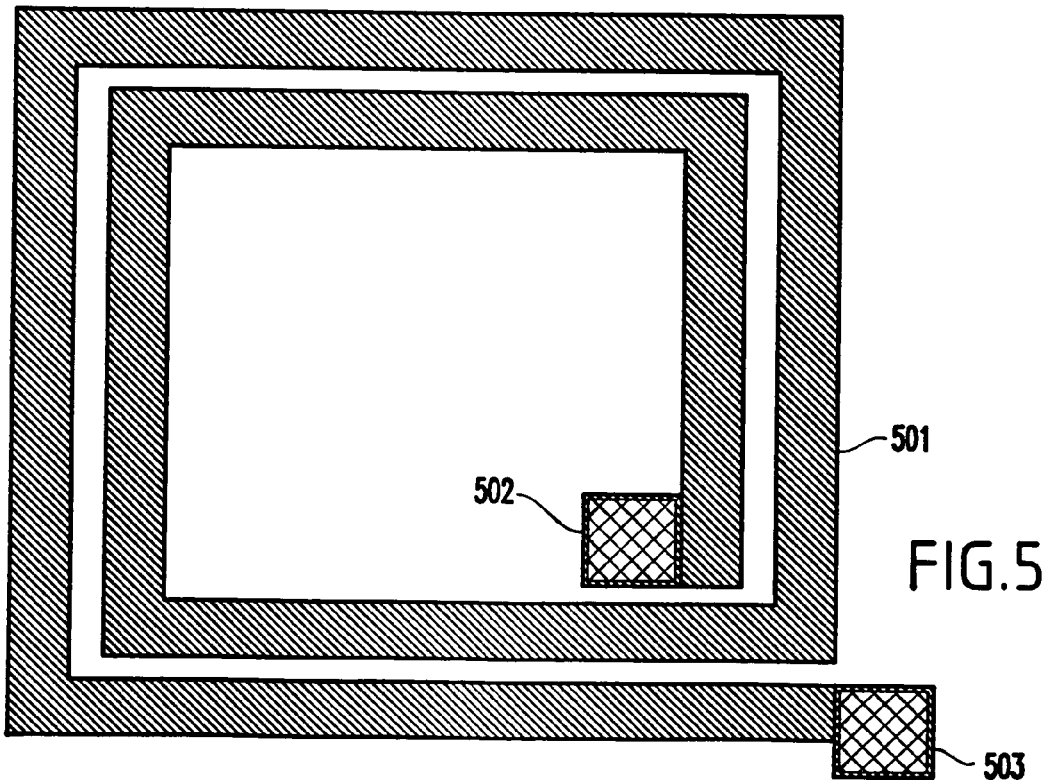
FIG. 5(b) is a schematic top-view diagram of an integrated circuit chip according to the invention.

In FIGS. 5(a) and 5(b) a spiral coil shape inductor 501 is shown. The inner electrode 502 and outer electrode 503 are connected to the integrated circuit chip 10 through the via conductors (209, 207) and metal levels (208, 205).

Figure 6:
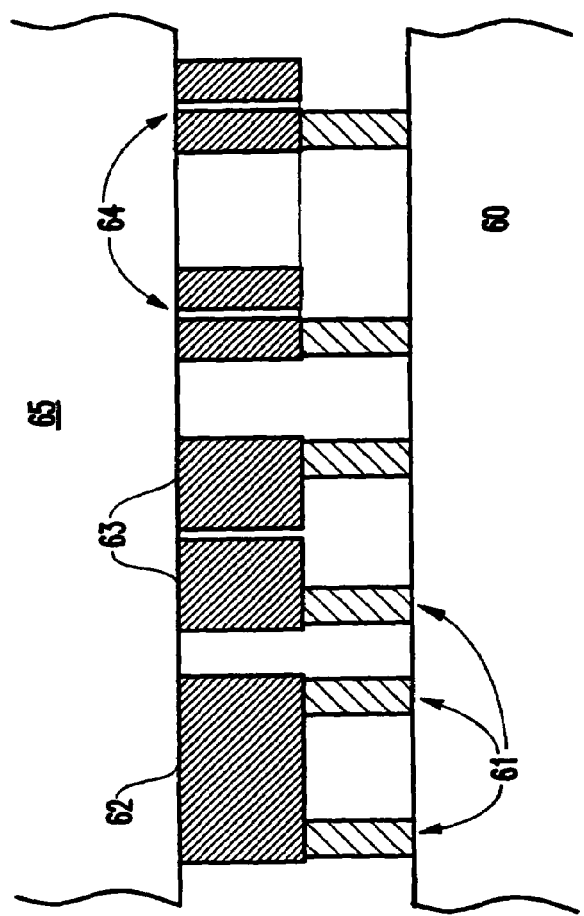
FIG. 6 is a schematic cross-sectional diagram of an integrated circuit chip according to the invention.

In an alternative embodiment, instead of fabricating the conducting polymer passive components on the finished device chips, the passive devices are first formed on a separated substrate and subsequently bonded to the device chips (see FIG. 6). Since the polymers in this embodiment are processed on a separate substrate, the processing temperature, device thickness, and chemical contamination is independent of the digital core formation processes. More importantly, with such a flip chip, the passive components processing is not directly on the device wafer and is placed on the device chip at the packaging level. Thus, there is no impact on the process contamination and yield loss due to additional processing. Since the patterns used for these passive components have large dimensions, the tolerance for the inter-chip bonding alignment is not critical. The flip chip shown in FIG. 6 includes an integrated circuit chip structure having contact pads 61. The passive devices, which can include a resistor 62, capacitor 63, and inductor 64 are separately formed upon a second substrate 65. The passive devices 62–64 are directly bonded to the contacts 61 using well known flip chip bonding techniques.

Figure 7:
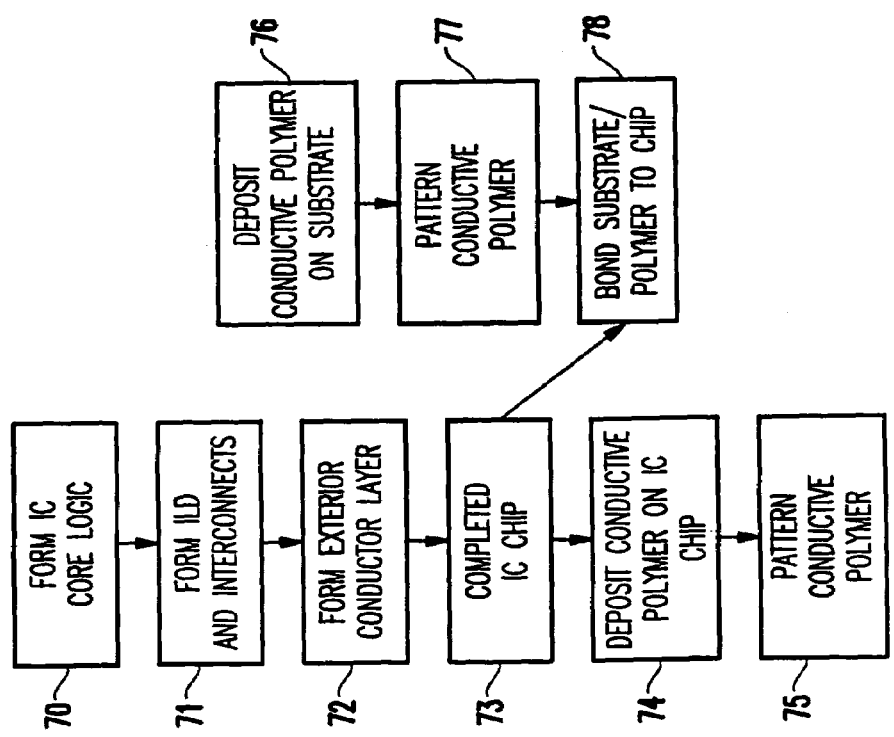
FIG. 7 is a flow diagram illustrating a preferred method of the invention.

FIG. 7 illustrates the methodology of the invention in flowchart form. In item 70, the invention forms the logic chip 203. Next, in item 71, the invention forms the various interlevel dielectrics (ILD) 204, 206, 210 and the various interconnects and vias 205, 207, 208. Lastly, the exterior conductor layer 209 (the last metalization layer) is formed in item 72. This completes the processing of the integrated circuit chip as shown in item 73. The invention then deposits a conductive polymer over the exterior conductor layer 209

(74) and patterns the conductive polymer using conventional masking and etching techniques.

In an alternative embodiment, the invention can separately (and/or in parallel) deposit the conductive polymer on a substrate (76) and then pattern the conductive polymer (77). This structure 62–65 is then bonded to the completed integrated circuit chip from item 73, as shown in item 78.

While the invention has been described in terms of preferred embodiments, those skilled in the art will recognize that the invention can be practiced with modification within the spirit and scope of the appended claims.

What is claimed is:

1. A method of manufacturing an integrated circuit chip structure comprising:

patterning a conductive polymer on a substrate; and
    bonding said patterned conductive polymer to an integrated circuit chip,
    wherein said patterning produces passive devices.

2. The method in claim 1, wherein said passive devices comprise RF devices.

3. The method in claim 1, wherein, said passive devices comprise at least one of resistors, capacitors, and inductors.

4. The method in claim 3, wherein said resistors comprise serpentine resistors.

5. The method in claim 3, wherein said capacitors comprise interdigitated capacitors.

* * * * *